US007999365B2

United States Patent
Hu et al.

(10) Patent No.: US 7,999,365 B2
(45) Date of Patent: Aug. 16, 2011

(54) PACKAGE FOR MONOLITHIC COMPOUND SEMICONDUCTOR (CSC) DEVICES FOR DC TO DC CONVERTERS

(75) Inventors: Kunzhong Hu, Irvine, CA (US); Chuan Cheah, Redondo Beach, CA (US); Bo Yang, San Diego, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/184,547

(22) Filed: Aug. 1, 2008

(65) Prior Publication Data
US 2009/0072368 A1 Mar. 19, 2009

Related U.S. Application Data

(60) Provisional application No. 60/953,717, filed on Aug. 3, 2007.

(51) Int. Cl.
H01L 23/552 (2006.01)
(52) U.S. Cl. ........ 257/676; 257/155; 257/355; 257/696; 257/E23.03; 257/E23.031; 257/E23.032; 257/E23.033; 257/E21.001; 438/123
(58) Field of Classification Search .......... 257/615, 257/676, E23.031, 155, 355, E23.032, E23.033, 257/E21.001, E23.03; 438/111, 112, 123; 428/571, 572, 643; 323/259, 282; 307/21
See application file for complete search history.

(56) References Cited

U.S. PATENT DOCUMENTS

| 2003/0090237 A1* | 5/2003 | Shenai et al. ................. 320/139 |
| 2003/0161111 A1* | 8/2003 | Yoshida et al. ............... 361/719 |
| 2005/0280163 A1* | 12/2005 | Schaffer et al. ............... 257/778 |
| 2006/0175627 A1* | 8/2006 | Shiraishi ......................... 257/99 |
| 2007/0096299 A1* | 5/2007 | Pavier ........................... 257/706 |
| 2008/0136390 A1* | 6/2008 | Briere ........................... 323/282 |
| 2008/0224300 A1* | 9/2008 | Otremba ....................... 257/693 |
| 2009/0103272 A1* | 4/2009 | Watanabe ..................... 361/748 |

FOREIGN PATENT DOCUMENTS
WO  WO 2007/049788 * 5/2007

* cited by examiner

*Primary Examiner* — Benjamin P Sandvik
*Assistant Examiner* — Farid Khan
(74) *Attorney, Agent, or Firm* — Farjami & Farjami LLP

(57) ABSTRACT

A multichip module defining a dc to dc converter employs a monolithic chip containing at least two III-nitride switches (a monolithic CSC chip) mounted on a conductive lead frame. The CSC chip is copacked with an IC driver for the switches and with the necessary passives. The module defines a buck converter; a boost converter, a buck boost converter, a forward converter and a flyback converter. The drain, source and gate pads of the monolithic CSC chip are connected to a lead frame by solder or epoxy or by bumping attach and a conductive connector or wire bonds connect the switch terminal to lead frame.

20 Claims, 6 Drawing Sheets

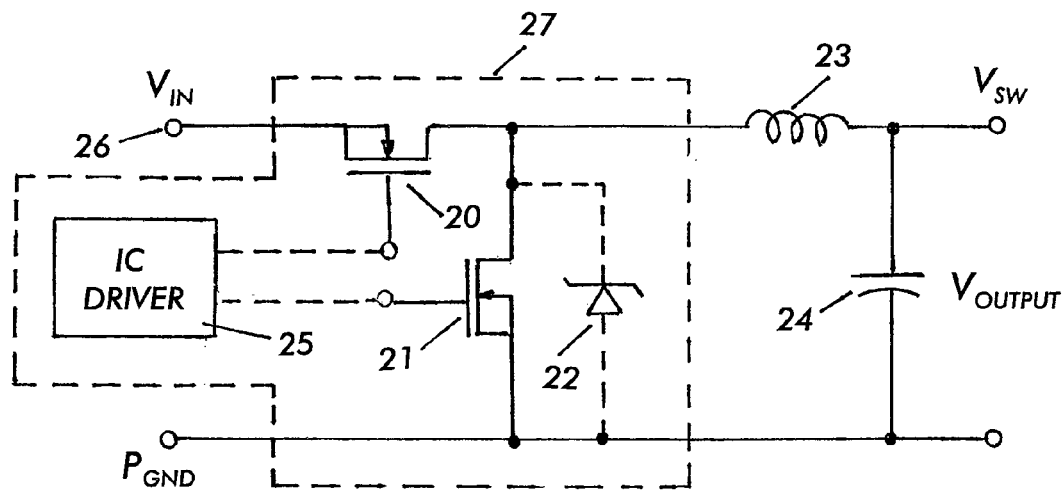
*FIG. 1 (BUCK CONVERTER)*
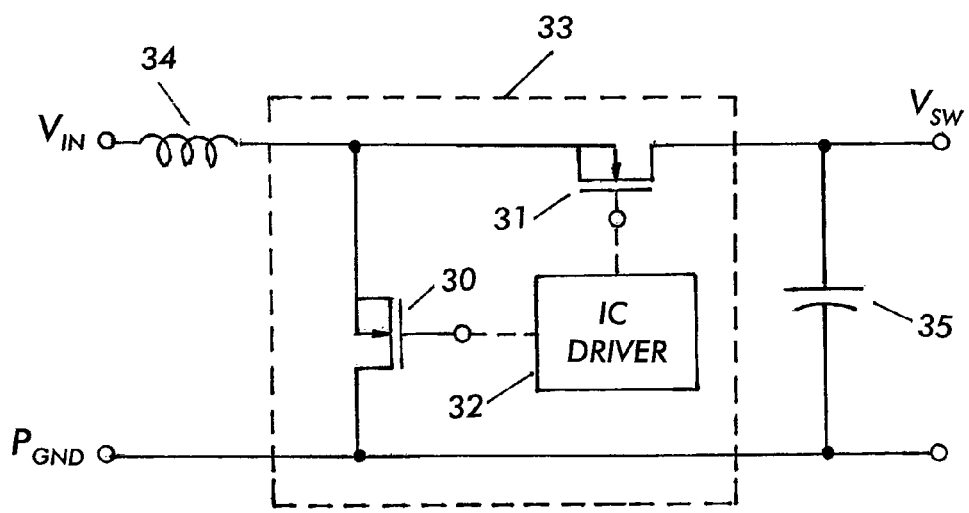
*FIG. 2 (BOOST CONVERTER)*

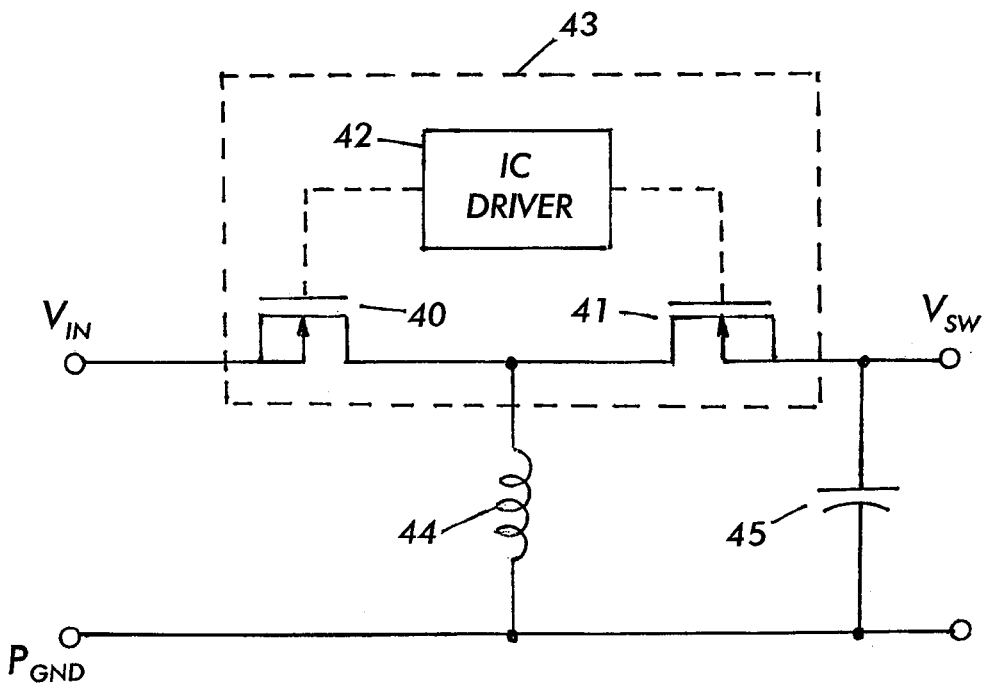
FIG. 3 *(BUCK-BOOST CONVERTER)*
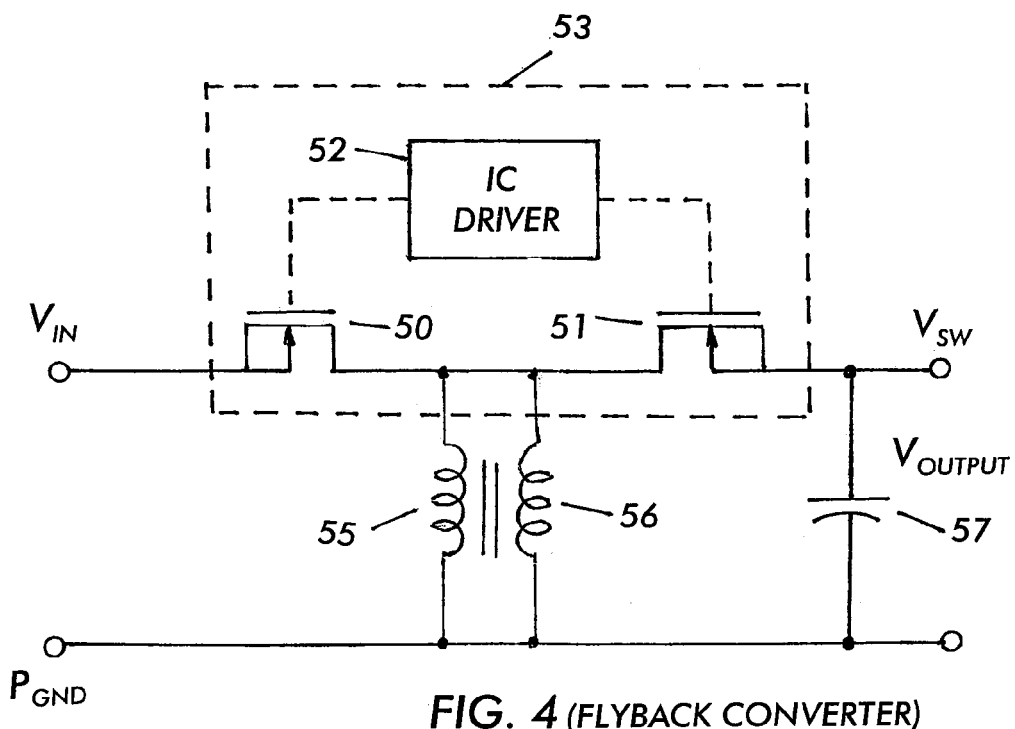
FIG. 4 *(FLYBACK CONVERTER)*

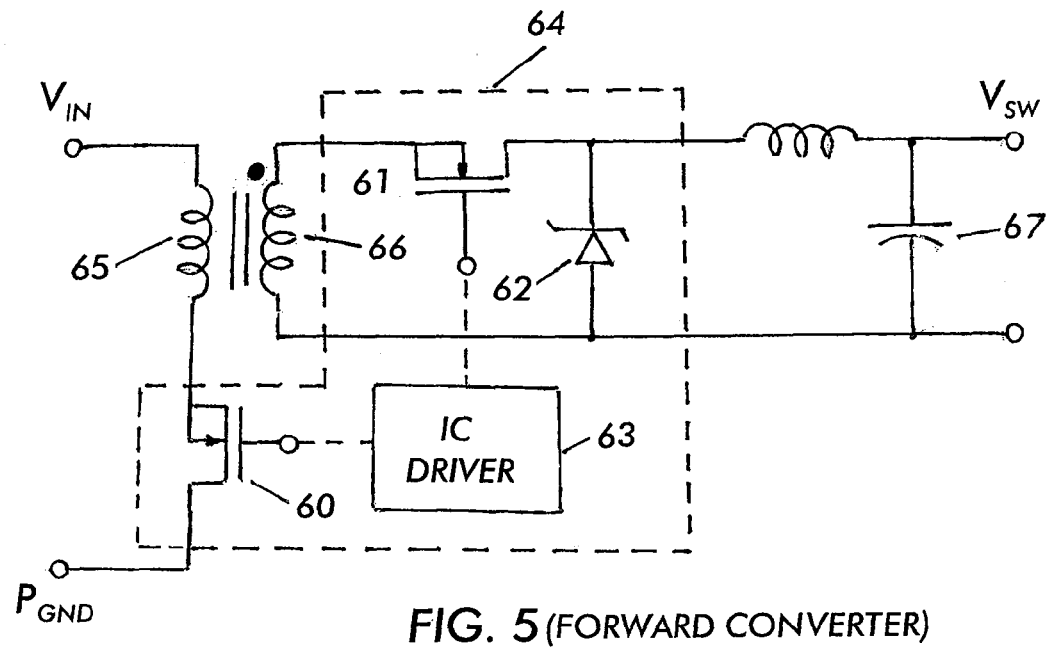
FIG. 5 (FORWARD CONVERTER)
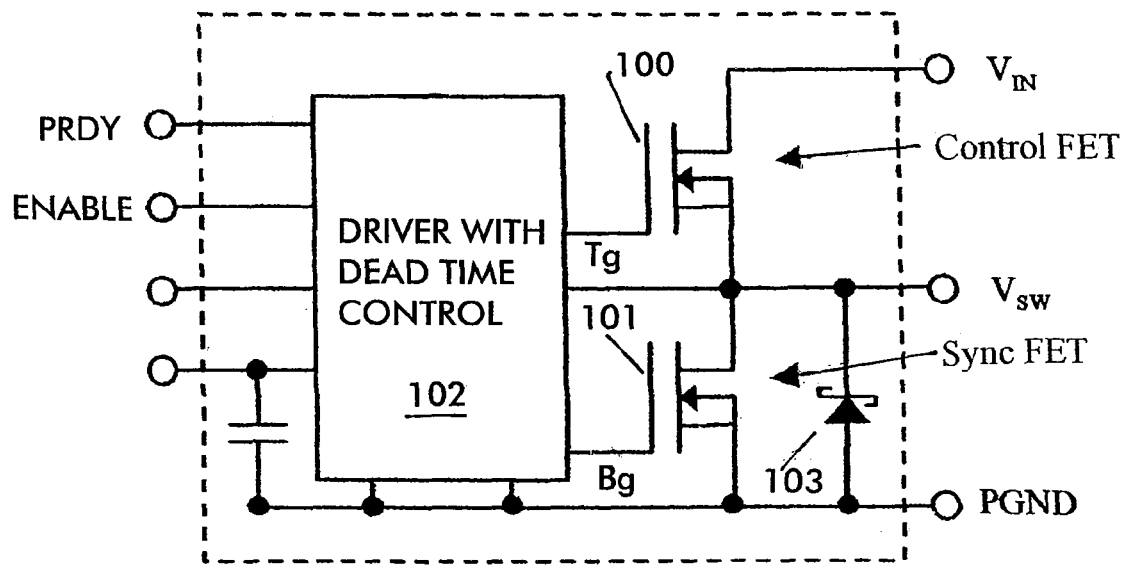
FIG. 6

Packaging method of monolithic CSC (option 1)

Package overmolding

Package expose molding

Monolithic CSC co-package with a driver

Packaging method of Monolithic CSC (option 2)

Packaging method of Monolithic CSC (option 3)

PACKAGE FOR MONOLITHIC COMPOUND SEMICONDUCTOR (CSC) DEVICES FOR DC TO DC CONVERTERS

RELATED APPLICATIONS

This application claims the benefit of U.S. Provisional Application No. 60/953,717, filed Aug. 3, 2007, the entire disclosure of which is incorporated by reference herein.

FIELD OF THE INVENTION

This invention relates to converter circuits and particularly dc to dc converters and to the packaging of such converters.

BACKGROUND OF THE INVENTION

Converter circuits for conversion of an input dc voltage to a higher or lower dc output voltage are well known. Such circuits may take the form of buck converter circuits, boost converter circuits, buck-boost converter circuits, flyback converter circuits, forward converter circuits and the like. The circuits are mounted in housings or as discretes applied to a printed circuit board or other substrates. It is preferred that they occupy as small as possible area on the support board.

These circuits commonly employ at least two field effect transistors (FETs) and an integrated circuit driver for turning the FETs on and off in a predetermined sequence. These FETs are normally mounted on a common conductive lead frame.

The FETs of the prior art are usually silicon based devices. Switch devices of the III-nitride family have been developed, (hereinafter GaN devices) and have also been employed as discrete devices in dc to dc converter circuits. Two or more such discrete GaN devices can be integrated in a single monolithic GaN based chip.

It would be desirable to form a dc to dc converter in which a single die can be mounted on a lead frame, with or without the integrated drive circuit. Such an arrangement would be more easily assembled, produces a smaller part count for a full circuit containing the dc to dc converter, and would occupy less area on a printed circuit board receiving the assembly.

SUMMARY OF THE INVENTION

In accordance with the invention, a monolithic CSC (or GaN) die with two or more switch elements for a dc converter circuit are packaged with or without an associated IC driver, for mounting on a common lead frame which can be easily connected to a printed circuit board. The monolithic CSC chip can be flip mounted if desired.

BRIEF DESCRIPTION OF THE DRAWINGS

FIG. 1 is a circuit diagram of a typical known buck converter circuit.

FIG. 2 is a circuit diagram of a typical known boost converter circuit.

FIG. 3 is a circuit diagram of a typical buck-boost converter circuit.

FIG. 4 is a circuit diagram of a typical flyback converter circuit.

FIG. 5 is a circuit diagram of a typical forward converter circuit.

FIG. 6 is a further diagram of the buck converter circuit of FIG. 1 with the two switches and their driver as a subassembly.

FIG. 9 shows the assembly of the CSC chip of FIG. 9, mounted on a substrate or printed circuit board with other components of FIG. 1 to form a multichip module (MCM) for a buck converter or the like.

DETAILED DESCRIPTION OF THE PREFERRED EMBODIMENTS

Figure 7:
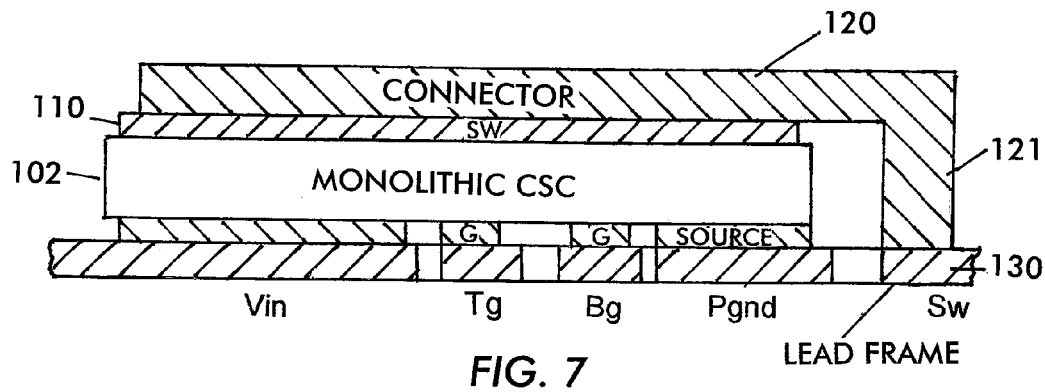
FIG. 7 shows a first embodiment of the invention for packaging the switches of FIG. 6 which are integrated into a monolithic CSC chip.

The invention deals with a novel converter package which can employ a monolithic chip containing plural CSC devices to enable a multichip module structure with reduced part count and area. The converter circuit can take many forms including those shown in FIGS. 1 to 5.

FIG. 1 shows a known buck converter circuit comprising FETs or other GaN switches 20, 21, a Schottky rectifier 22 and an output inductor and capacitor 23 and 24, respectively. An IC driver 25 controls the turn on/turn off of devices 20, 21 in the usual manner. A positive input dc voltage is applied to terminal Vin relative to ground terminal $P_{GND}$. The output voltage $V_{SW}$ is accurately controlled as by PWM control of switches 20, 21 by driver 25.

As will be later seen, and in accordance with the invention, switches 20, 21 are monolithically formed and may be mounted with the driver 25 on a common lead frame within the dotted line block 27.

The invention can also be used for the boost converter circuit of FIG. 2, having monolithically formed CSC switches 30, 31 and driver IC 32, which may be subassembled in dotted line block 33. In FIG. 2, terminal $V_{IN}$ is in series with inductor 34 and an output capacitor 35 is connected from output terminal $V_{SW}$ to ground $P_{GND}$. The circuit of FIG. 2 can produce a higher voltage at $V_{SW}$ than the input voltage $V_{IN}$.

The invention is also applicable to a buck-boost converter as shown in FIG. 3. In this circuit, monolithically formed CSC devices 40, 41 may be housed with their IC driver 42 in the subassembly 43. An inductor 44 is connected to the node between switches 40, 41 and an output capacitor 45 is also provided at Vsw.

FIG. 4 shows a flyback converter circuit which, in accordance with the invention has monolithically formed devices 50, 51 and an IC driver 52 in subassembly 53. A two winding transformer having windings 55, 56 connected to switches 50, 51 respectively is provided, as is the output capacitor 57.

As a still further example, the invention can be applied to the forward converter circuit of FIG. 5 in which CSC switches 60, 61 and diode 62 may be monolothically formed in a common chip and may be mounted with their IC driver 63 in a subassembly 64. Transformer windings 65, 66 and output capacitor 67 are also provided to complete the circuit.

In each of the above embodiments, the monolithically formed CSC devices are mounted on a suitable lead frame, with or without their IC driver and connection pins extend from the lead frame as needed to make connection to the circuit terminals and to the circuit inductor/transformer capacitor terminals.

One embodiment of the invention is further shown in FIGS. 6, 7, 8 and 9 for the use of the invention in the buck converter circuits of FIG. 1.

Thus, buck converter circuits, such as the circuit of FIGS. 1 and 6 are well known. In these circuits, discrete FETs, including a high side or control FET 100 is in series with a low side or synchronous (synch) FET 101. A Schottky device 103 is also provided across device 101. An input d-c voltage is applied to terminal $V_{IN}$; the node between FETs 100 and 101 is connected to an output terminal $V_{SW}$ and the low side FET 101 is connected to ground terminal $P_{GND}$. A suitable integrated circuit (IC) driver 20, which may have dead time control, applies pulse width modulated signals to the gate of FETs 10 and 11 to turn them alternately on and off to control the output voltage at SW as desired. An output inductor, not shown, is connected to terminal $V_{SW}$ and to the load (not shown). Suitable inputs are connected to the driver 20 to drive the FETs 10 and 11 as desired.

The FETs 10 and 11 were commonly silicon based. It is now possible to make such FETs as GaN based switching devices or the like (defined herein as compound semiconductor devices, or CSC devices) in which the two FETs or switches 10 and 11 can be combined into one monolithic chip.

It would be desirable to employ a single CSC chip in a package to define a buck converter circuit because of the benefits or reduced part count and reduced board area.

Figure 8:
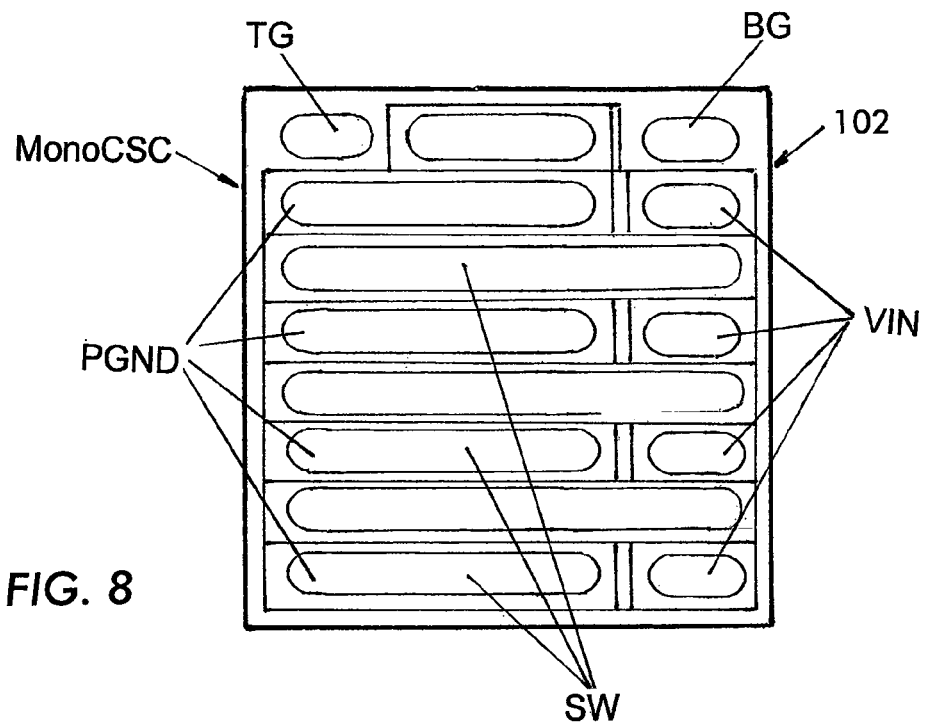
FIG. 8 is a top view of the monolithic CSC chip of FIG. 7.
Figure 9:
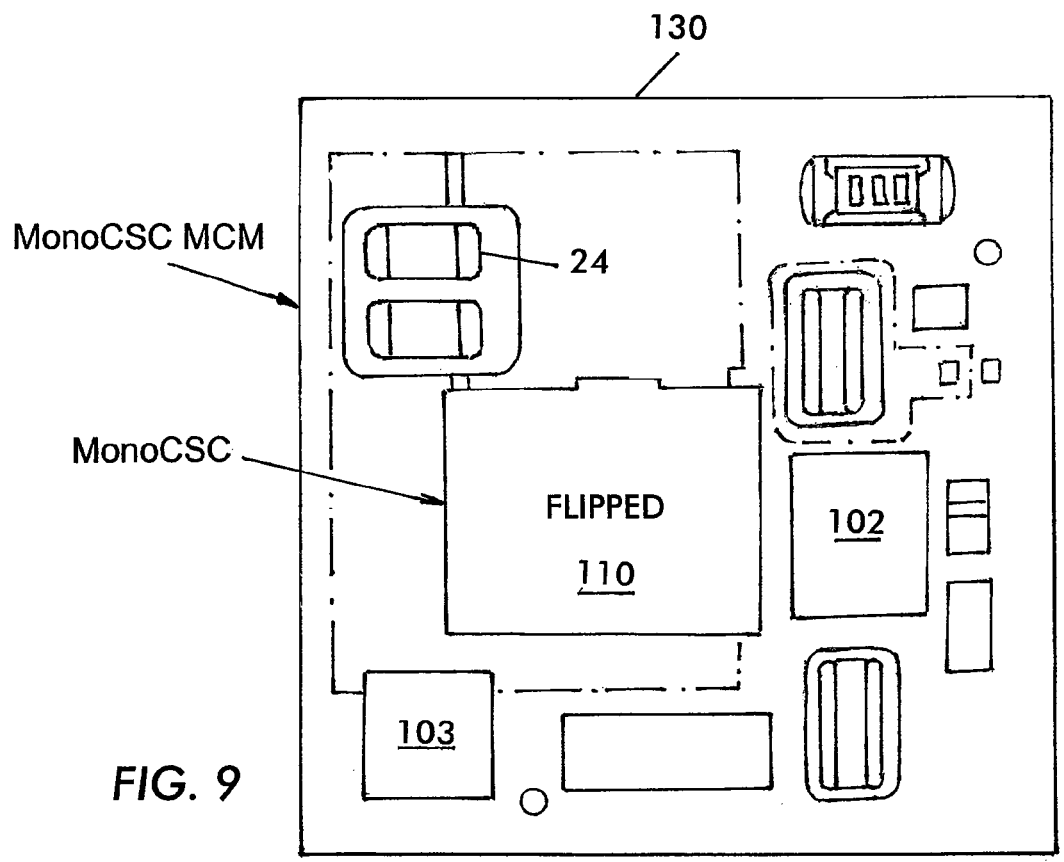

FIGS. 7, 8 and 9 show a novel package for the circuits of FIG. 6. Thus, the devices 100 and 101 are formed monolithically in a common CSC chip 102. Chip 102 is best shown in top view in FIG. 8 for a chip in which the major terminals are on one surface terminals are on one surface of the chip. Thus, the top surface of chip 102 has a number of spaced laterally extending conductive stripes defining the source and drain terminals (SW) of devices 100 and 101 respectively; the $P_{GND}$ terminals, defining the other drain and source terminals of switches 100 and 101 respectively; the $V_{IN}$ terminal of control device 100; the gate terminals Tg and Bg of CSC devices 100 and 101 respectively; and the SW contact 110 over the opposite (top in FIG. 8) surface of chip 102. A metal connector 120 is connected to a lead frame SW contact 110 as by conductive adhesive, solder or the like and has a descending leg 121 which ends coplanarly with the bottom (In FIG. 7) of the CSC device electrodes.

A conductive lead frame 130 (FIGS. 7 and 9) which may be a conductive organic or metal lead frame or the like is then provided to receive the terminals $V_{IN}$, Tg, Bg, $P_{GND}$, and SW in flipped arrangement as shown in FIG. 9 and connected by bumping attach, solder attach or epoxy attach or the like.

It will be apparent that GaN switching devices for the circuits of FIGS. 2 to 5 can similarly be monolithically formed and mounted in an MCM module like that of FIGS. 8 and 9, with the same benefit of reduced part count.

Figure 10:
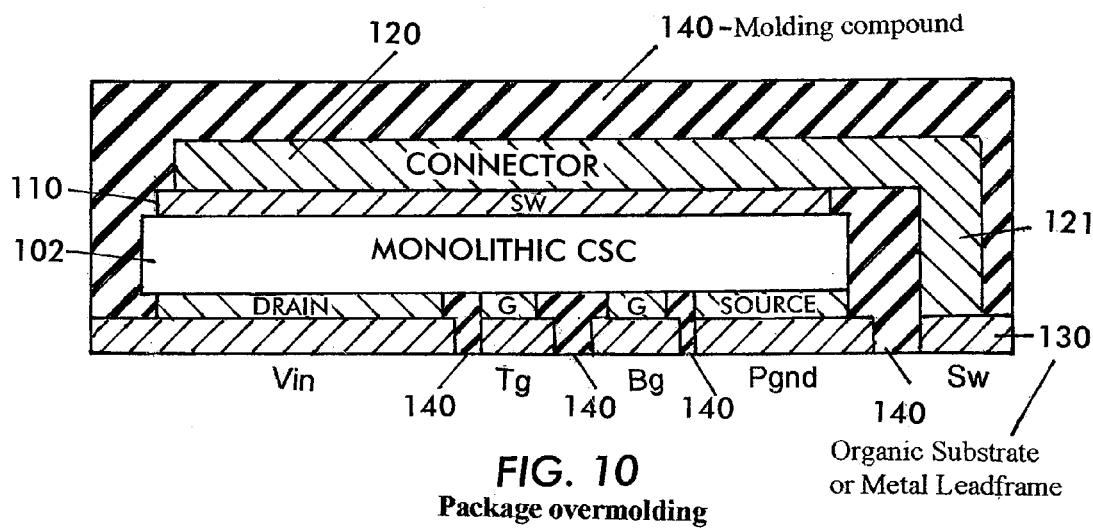
FIG. 10 shows the structure of FIG. 7 with package overmolding.

The monolithic chip subassembly of FIGS. 7 and 8 can be protected by a molding compound 140 as shown in FIG. 10. The compound 140 can also fill the volumes between the separations in the lead frame 130.

Figure 11:
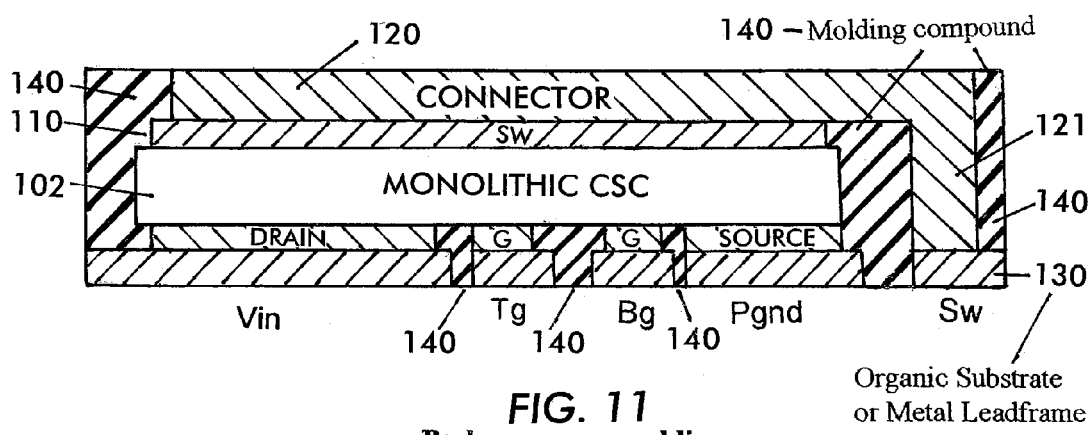
FIG. 11 shows the structure of FIG. 10 with an exposed top connector.

As shown in FIG. 11, the molding compound 140 over the connector 120 can be removed to expose the top of the connector 120.

Figure 12:
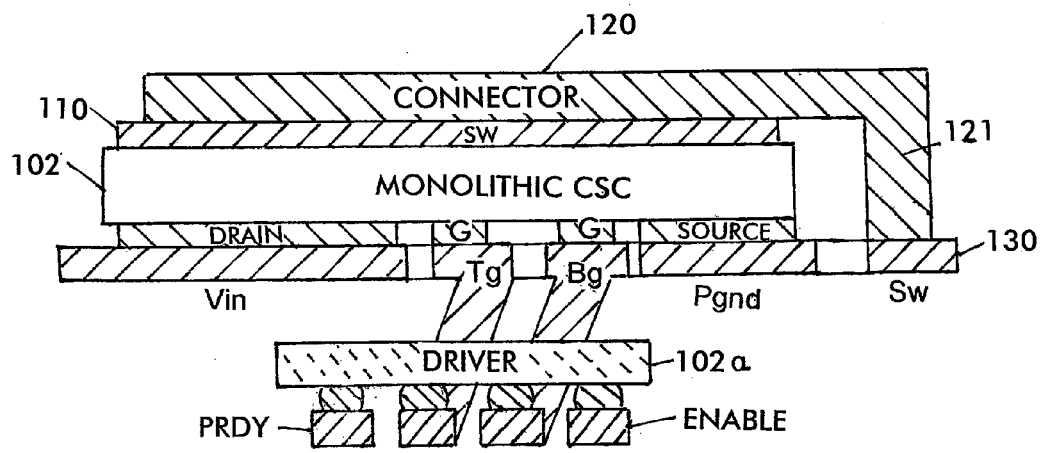
FIG. 12 shows the package of FIG. 7 with an integrated IC driver.

The driver 102 of FIG. 6 may be copacked with the monolithic subassembly of FIG. 7 as shown in FIG. 12. Thus, driver 102 is schematically shown as having input terminals including terminals PRDY and ENABLE, and other timing terminals may have outputs connected to terminals Tg and Bg of the monolithic chip 102.

Figure 13:
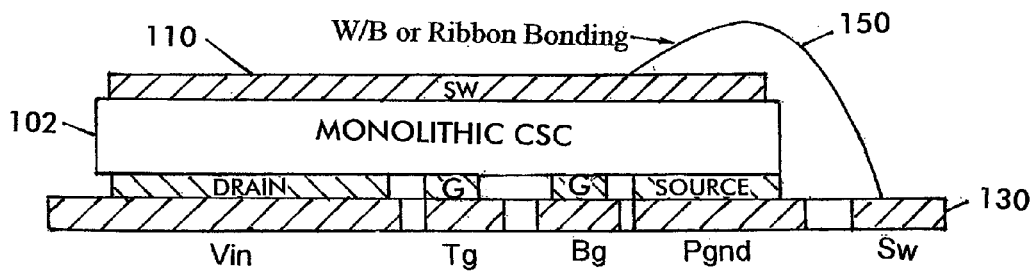
FIG. 13 shows a further embodiment of the CSC monolithic chip of FIG. 7 with wire-bond or ribbon-bonding connections to the lead frame.

FIG. 13 shows an embodiment of the invention in which the connector 120 of FIG. 7 is replaced by wire bond or ribbon bond connector 150 to connect SW terminals 110 to the SW position on lead frame 130.

Figure 14:
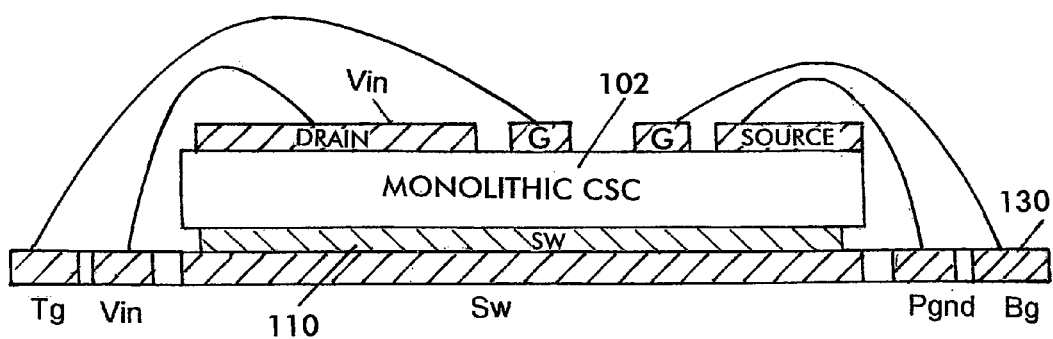
FIG. 14 shows a still further embodiment of the invention with the monolothic CSC flipped and with wire bonded gate and source electrodes.

FIG. 14 shows a further option in which the assembly of FIG. 7 is flipped so that the $V_{IN}$ terminal, gate terminals G of switches 100 and 101 respectively and the source terminals of the switches are connected by wire bonds to lead frame regions $V_{IN}$, Tg, $P_{GND}$ and Bg respectively of lead frame 130. The SW terminal 110 of the monolithic chip 102 is connected to lead frame area SW in FIG. 14.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A dc to dc converter which includes first and second III-nitride switches-which are monolithically formed in a common monolithic chip;
    said monolithic chip not housing an IC driver for said first and second switches; and
    said monolithic chip having a first surface containing spaced and insulated source, drain and gate terminals for said first and second III-nitride switches and a second surface containing an output SW terminal; and
    a flat conductive lead frame having spaced source, drain, gate and SW regions electrically connected to said source, drain, gates and said output SW terminal respectively.

2. The converter of claim 1, wherein said converter further includes a mounting substrate for mounting said monolithic chip;
    an IC driver for said first and second switches mounted on said mounting substrate and adjacent to said monolithic chip and connected to said gate terminals.

3. The converter of claim 2, which further includes passive components including an inductive device and an output capacitor mounted on said substrate and coupled to said switches to complete the converter circuit.

4. The converter of claim 2, wherein said monolithic chip is mounted with said first surface facing the upper surface of said mounting substrate.

5. The converter of claim 1, wherein said converter is selected from the group consisting of a buck converter, a boost converter, a forward converter, a buck-boost converter and fly back converter.

6. The converter of claim 1, wherein said monolithic chip is overmolded with insulation plastic.

7. The converter of claim 1, wherein said output SW terminal of said monolithic chip is wire bonded to said lead frame.

8. The converter of claim 1, wherein said output SW terminal of said monolithic chip directly connected to a facing corresponding area of said lead frame.

9. A dc to dc converter comprising:
    a common monolithic chip housing monolithically formed first and second switches;
    said monolithic chip not housing an IC driver for said first and second switches; and
    said monolithic chip comprising a first surface containing spaced and insulated source, drain and gate terminals for said first and second switches and a second surface containing an output SW terminal.

10. The converter of claim 9, wherein said first and second switches comprise III-nitride switches.

11. The converter of claim 9, wherein said first and second switches comprise GaN switches.

12. The converter of claim 9, wherein said source, drain and gate terminals for said first and second switches comprise a plurality of spaced laterally extending conductive stripes.

13. The converter of claim 9, wherein said converter further comprises an IC driver for said first and second switches, said IC driver copacked with said monolithic chip.

14. The converter of claim 13, wherein said IC driver is disposed below said monolithic chip.

15. A dc to dc converter comprising:
a common monolithic chip housing monolithically formed first and second switches;
said monolithic chip not housing an IC driver for said first and second switches; and
said monolithic chip comprising a first surface containing spaced and insulated source, drain and gate terminals for said first and second switches and a second surface containing an output SW terminal;
a flat conductive lead frame having spaced source, drain, gate and SW regions electrically connected to said source, drain, gates and said output SW terminal respectively.

16. The converter of claim 1, comprising a mounting substrate mounting said monolithic chip;
an IC driver connected to said gate terminals and mounted on said mounting substrate adjacent to said monolithic chip.

17. The converter of claim 16, comprising passive components including an inductive device and an output capacitor mounted on said substrate and coupled to said switches to complete said converter circuit.

18. The converter of claim 14, comprising a metal connector electrically connected to and said output SW terminal and said SW region of said conductive lead frame, said metal connector including a descending leg which ends coplanarly with said source, drain and gate terminals on said first surface of said monolithic chip.

19. The converter of claim 15, wherein said output SW terminal of said monolithic chip is wire bonded to said lead frame.

20. The converter of claim 15, wherein said output SW terminal of said monolithic chip directly connected to a facing corresponding area of said lead frame.

* * * * *

UNITED STATES PATENT AND TRADEMARK OFFICE
CERTIFICATE OF CORRECTION

| | | |
|---|---|---|
| PATENT NO. | : 7,999,365 B2 | Page 1 of 1 |
| APPLICATION NO. | : 12/184547 | |
| DATED | : August 16, 2011 | |
| INVENTOR(S) | : Hu et al. | |

It is certified that error appears in the above-identified patent and that said Letters Patent is hereby corrected as shown below:

In the claims, column 6, line 14, "connected to and said" should be changed to --connected to said--

Signed and Sealed this
Thirteenth Day of December, 2011

David J. Kappos
*Director of the United States Patent and Trademark Office*